United States Patent [19]
Ackley et al.

[11] Patent Number: 5,256,596
[45] Date of Patent: Oct. 26, 1993

[54] TOP EMITTING VCSEL WITH IMPLANT

[75] Inventors: Donald E. Ackley; Chan-Long Shieh, both of Paradise Valley, Ariz.

[73] Assignee: Motorola, Inc., Schaumburg, Ill.

[21] Appl. No.: 857,877

[22] Filed: Mar. 26, 1992

[51] Int. Cl.$^5$ ............................................. H01L 21/20
[52] U.S. Cl. ...................................... 437/129; 372/45
[58] Field of Search ................... 437/129; 372/45-50, 372/96, 97

[56] References Cited

U.S. PATENT DOCUMENTS

| | | | |
|---|---|---|---|
| 4,949,350 | 8/1990 | Jewell et al. | 372/45 |
| 5,034,958 | 7/1991 | Kwon et al. | 372/45 |
| 5,088,099 | 2/1992 | Chen et al. | 372/45 |
| 5,115,441 | 5/1992 | Kopf et al. | 372/45 |
| 5,132,982 | 7/1992 | Chan et al. | 372/50 |
| 5,206,871 | 4/1993 | Deppe et al. | 372/45 |

FOREIGN PATENT DOCUMENTS

| | | | |
|---|---|---|---|
| 0021090 | 1/1991 | Japan | 372/46 |
| 0021091 | 1/1991 | Japan | 372/46 |

OTHER PUBLICATIONS

Geels et al "Submilliamp Threshold Vertical-cavity laser diodes" Appl. Phys. Letts 57(1990), pp. 1605-1607.

Geels et al "Low Threshold Planarised Vertical-Cavity Surface-Emitting Lasers" IEEE Photonics Technology Letts 2(1990), 231-236.

Yang et al "Low threshold operation of a GaAs single quantum-well mushroom structure surface-emitting laser" Appl. Phys. Letts 58(1991), pp. 1780-1782.

Primary Examiner—Olik Chaudhuri
Assistant Examiner—Ramamohan Rao Paladugu
Attorney, Agent, or Firm—Eugene A. Parsons

[57] ABSTRACT

VCSELs including a central active layer with upper and lower mirror stacks wherein a circular trench is formed in one mirror stack to define a lasing area. The trench reduces reflectivity to prevent lasing outside the operating area and a deep beryllium implant in either of the mirror stacks, along with the trench, confines current distribution to maximize power output and efficiency. A transparent metal contact is used as a top contact in one embodiment.

11 Claims, 3 Drawing Sheets

TOP EMITTING VCSEL WITH IMPLANT

The present invention pertains to vertical cavity surface emitting lasers (VCSELs) and more specifically to top emitting VCSELs with higher power and greater efficiency.

BACKGROUND OF THE INVENTION

Recently, there has been an increased interest in a new type of laser device called a vertical cavity surface emitting laser (VCSEL). Advantages of VCSEL devices are that the device is smaller, has potentially higher performance, and is potentially more manufacturable. These advantages are due in part from advances in epitaxial deposition techniques such as metal organic vapor phase epitaxy (MOVPE) and molecular beam epitaxy (MBE).

However, even with these advances in deposition techniques there is difficulty during manufacturing in controlling the mode of operation of the laser and in controlling current distribution within the laser. In general, VCSELs are formed by depositing a plurality of layers on a substrate and then etching the layers down to the substrate to form the VCSEL. See, for example, U.S. Pat. No. 5,034,092, entitled "Plasma Etching of Semiconductor Substrates", issued Jul. 23, 1991, assigned to the same assignee and included herein by reference.

The etching of mesas to form VCSELs has two disadvantages. The etching process damages the crystal at the surface and leads to increased threshold currents and reduced reliability. The mesas form a waveguide with a large discontinuity in the refractive index which makes it very difficult to control the optical modes without making devices of very small dimension, which increases the series resistance and reduces the maximum output power. Generally this results in devices which are less efficient and less stable.

SUMMARY OF THE INVENTION

It is a purpose of the present invention to provide new and improved top emitting VCSELs that are easier to manufacture.

It is a further purpose of the present invention to provide new and improved top emitting VCSELs that produce higher output power and have a higher efficiency.

The above problems and others are solved and the purposes realized by a method of fabricating a top emitting VCSEL including first and second stacks of mirrors deposited on either side of an active layer comprising the steps of defining an emitting area in the second stack of mirrors, etching the second stack of mirrors to form a trench surrounding the emitting area and extending the depth of the trench sufficiently to reduce reflectivity below an amount required to support lasing in a non-lasing volume of the laser between the trench area and the active layer, and implanting an impurity in the non-lasing volume of one of the first and second stacks of mirrors to form an implant volume having a different conductivity type than the one of the first and second stacks in which the implant is formed, and forming the implant volume so as to define a lasing volume generally axially aligned with the emitting area.

Further, the above problems and others are solved and the purposes realized by a top emitting VCSEL including an active area with opposed major surfaces, a first mirror stack on one major surface, a second mirror stack on the other major surface at least a portion of which is formed with a mesa having a generally circular cross-section and an axis substantially perpendicular to the first and second stacks of mirrors, the mesa defining a lasing volume generally axially aligned therewith, and an impurity implant in one of the first and second stacks of mirrors forming an implant volume having a different conductivity type than the one of the first and second stacks in which the implant is formed, and the implant volume being formed to define a current path generally axially aligned with the lasing volume and substantially coextensive with the lasing volume.

BRIEF DESCRIPTION OF THE DRAWINGS

Referring to the drawings.

DESCRIPTION OF THE PREFERRED EMBODIMENTS

Figure 1:
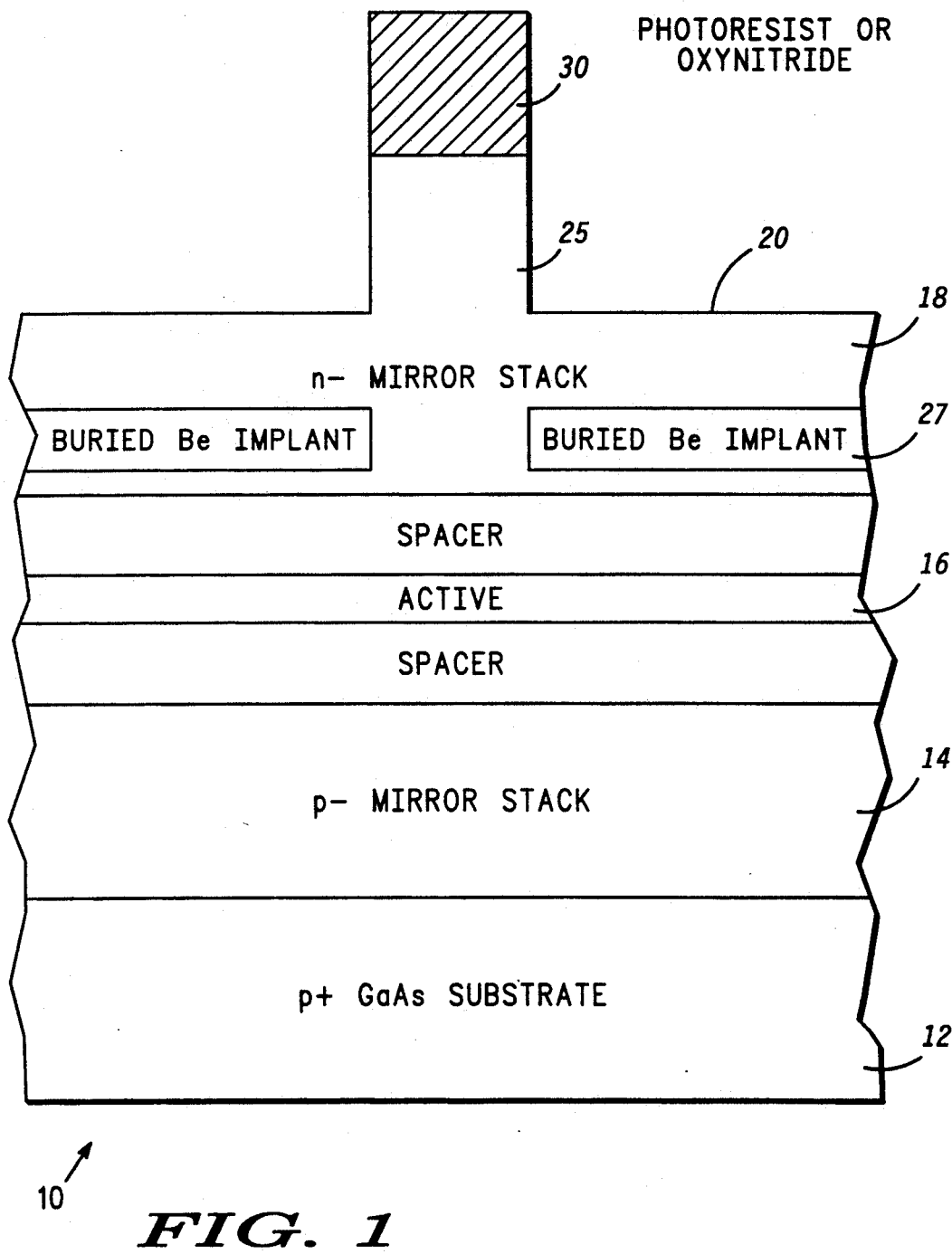
FIG. 1 is an intermediate, simplified sectional view of a top emitting VCSEL incorporating the present invention.

Referring specifically to FIG. 1, an intermediate structure in the manufacture of a top emitting vertical cavity surface emitting laser (VCSEL) 10 is illustrated in a sectional view. Laser 10 is formed on a substrate 12, which in this example, is made of p-doped gallium arsenide. Deposition of alternating layers of n-doped aluminum gallium arsenide and aluminum arsenide (or aluminum gallium arsenide with a different aluminum mole fraction) form a first stack 14 of reflectors or mirrors for laser 10. An active region 16 is deposited on the upper surface of first mirror stack 14. A second stack 18 of reflectors or mirrors is epitaxially deposited on active layer 16. Detailed construction of first mirror stack 14, active region 16 and second mirror stack 18 is presented in U.S. Pat. No. 5,034,092, entitled "Plasma Etching of Semiconductor Substrates", issued Jul. 23, 1991, assigned to the same assignee and included herein by reference.

Once first mirror stack 14, active layer 16 and second mirror stack 18 are completed, the structure must be patterned to form one or more individual VCSELs. In the present specific embodiment the patterning is accomplished as follows. The upper surface of second mirror stack 18 is provided with a layer of photoresist, alone or in combination with oxynitride material in any of the well known methods. The photoresist layer is exposed and material is removed to define the position and size of a trench 20. Trench 20 is then formed by etching mirror stack 18 by any convenient means, such as ion milling or the etch processes disclosed in the above identified patent '092. In general, trench 20 extends completely around and defines an operating area, or mesa, 25, which in this specific embodiment has a generally circular cross-section.

In this specific embodiment, trench 20 extends into mirror stack 18 from the upper surface thereof, to a depth of almost one half the complete dimension of first mirror stack 14. While this depth is convenient for reasons that will become apparent presently, it is only necessary that trench 20 be sufficiently deep to reduce reflectivity of mirror stack 18 in the volume between the bottom of trench 20 and active layer 16 so that a non-lasing volume is produced beneath trench 20. The non-lasing volume surrounds a lasing volume below mesa 25, which lasing volume is substantially coaxial with mesa 25. In at least some applications lasing will not be supported when the reflectivity is reduced to less than approximately 98%. A complete disclosure of the construction of laser 10 with mesa 25 is available in a copending application entitled "Patterned Mirror Vertical Cavity Surface Emitting Laser", filed of even date herewith and assigned to the same assignee.

With trench 20 formed to the desired depth, a deep implant of an impurity or doping material, such as beryllium, etc., is made in second mirror stack 18 to form a buried implant layer 27 in the non-lasing volume of second mirror stack 18. Typically the thick photoresist or silicon oxynitride layer 30 is used both as the mask for etching trench 20 and the mask for implanting the impurity. The impurity is chosen to produce a conductivity different from the conductivity of second mirror stack 18. In the specific embodiment illustrated, second mirror stack 18 has n-type conductivity and implant layer 27 has p-type conductivity. Further, in this specific embodiment beryllium is used as the impurity to achieve the deepest buried implant because it is the lightest generally used impurity. However, it will be understood that any of the well known implant materials commonly utilized in the semiconductor industry can be utilized as implant 27. Also, because of difficulty in implanting the impurity at the desired depth, trench 20 may be formed deeper than would normally be necessary to obtain the desired reduction in reflectivity. Thus, a buried pnpn structure is formed in the non-lasing volume of second mirror stack 18 which presents a reverse semiconductor junction to prevent current flow therethrough.

Implant layer 27 substantially confines current flow within laser 10 to the lasing volume generally coaxial with and beneath mesa 25. Also, the volume beneath mesa 25 generally defines the volume of laser 10 within which lasing occurs because of the reflectivity reduction produced by trench 20. By controlling current distribution to only the desired lasing volume a minimum of current is wasted and the efficiency of laser 10 is maximized. Further, the larger area of operation, while increasing the threshold current, reduces the series resistance and further increases the output power. Implant layer 27 controls current spreading, independent of the depth of trench 20, even though it may be helpful to increase the depth of trench 20 to achieve a desired depth of implant layer 27.

In the present method of manufacture, the mode size for the lowest order mode is predetermined and the diameter of mesa 25 is set equal thereto. Since lasing only occurs within the volume below and axially aligned with mesa 25, masking the structure for etching of trench (or trenches) 20 is not crucial. In general, the depth of trench 20 will be such that no contact with active layer 16 is made, so that reliability is enhanced. Also, the width of trench 20 is not crucial and may be any convenient width, depending upon the application and following manufacturing steps.

Figure 2:
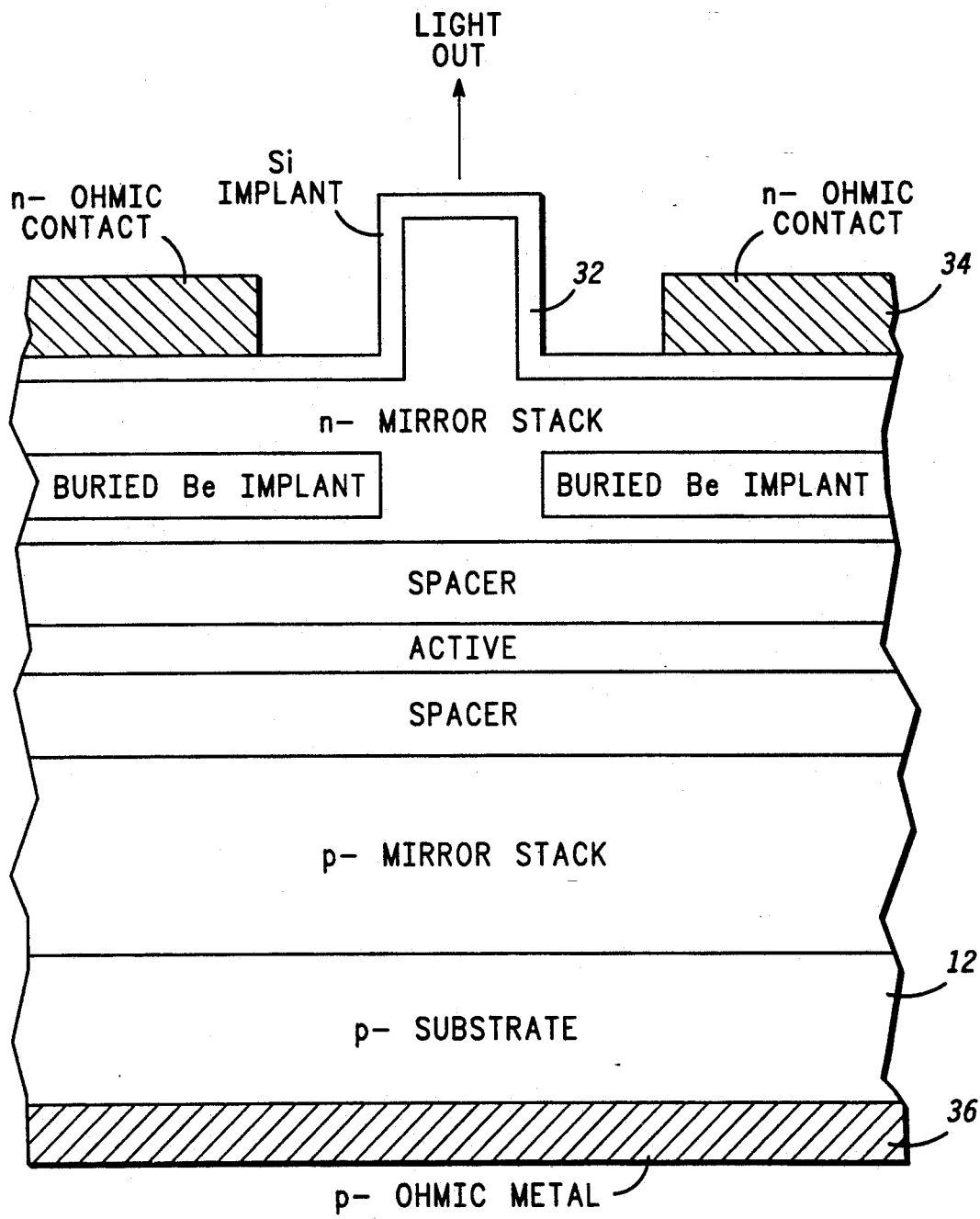
FIG. 2 is a view similar to FIG. 1 of a completed structure.

Referring to FIG. 2, after the implant, mask layer 30 is removed and an optional layer 32 of Si implant is formed on the upper surface of laser 10 to prevent surface conversion. Laser 10 is then annealed to activate the implant and form the buried implant layer 27. A n-metal layer 34 is deposited on the surface of laser 10 outside mesa 25 to act as a first electrical contact for the application of threshold current thereto. A p-metal layer 36 is deposited on the back (lower) surface of substrate 12 to serve as a second electrical contact for the application of threshold current. Typically, metal layers 34 and 36 are made of nickel, germanium, gold and titanium, platinum, gold respectively. Metal layers 34 and 36 are fabricated so that geometric patterns are formed by using a common liftoff process. It should be understood that other masking structures and methods could be used to fabricate geometric patterns such as photoresist, dielectrics or the like.

Figure 3:
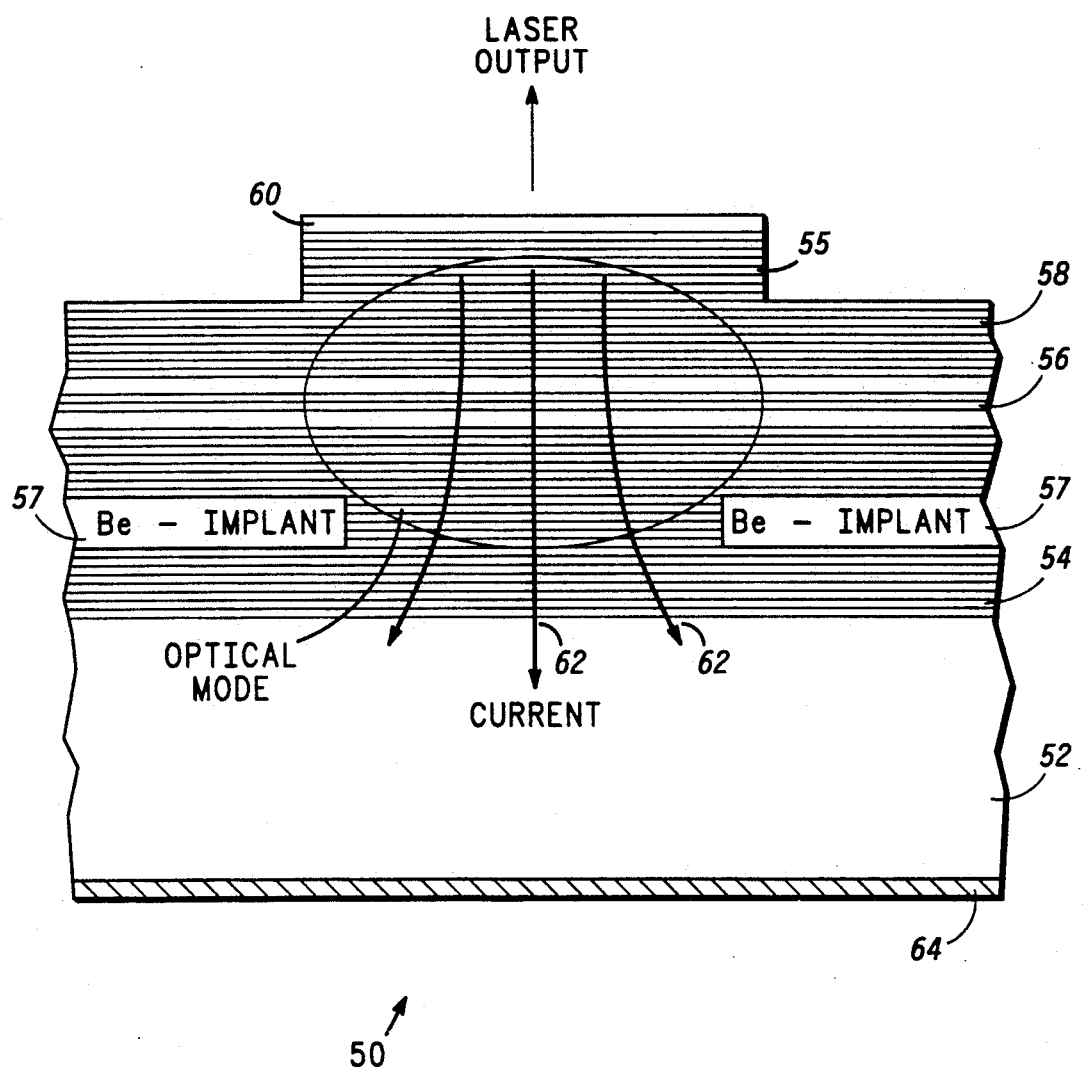
FIG. 3 is a sectional view of another embodiment of a top emitting VCSEL incorporating the present invention.

FIG. 3 illustrates a sectional view of another embodiment of a top emitting VCSEL 50 incorporating the present invention. In general, mirror stacks and active portion of VCSEL 50 are constructed the same as VCSEL 10 of FIG. 1 except that they are formed on an n-type substrate 52 and an implant layer 57 is implanted in a lower, or first, mirror stack 54 which is also an n-type material. In this embodiment implant layer 57 includes a p-type material. A second mirror stack 58 is p-type material so that implant 57 forms a pnpn junction to prevent the flow of current therethrough and, thereby, direct current flow through the lasing volume beneath and generally coaxial with a mesa 55. It will be understood from this example that various different types of conductivity material can be utilized to form the VCSEL and the only requirement is that the implant layer be positioned to direct current through the lasing volume and to prevent dispersion of current through non-lasing portions of the VCSEL.

To form the upper electrical contact of VCSEL 50, a layer 60 of transparent metal, p-contact material is deposited on the upper surface of mesa 55 to form a first electrical contact. Typical material which might be utilized as the transparent metal is indium tin oxide (ITO). Because layer 60 is optically transparent, it can be deposited directly over the light emitting area (mesa 55) and will not impede light emission. A second metal layer 64, which is this embodiment is n-type material, is deposited on the back (lower) surface of substrate 52 to form a second electrical contact. An additional advantage of this specific structure lies in the fact that mesa 55 also aids in confining the current to the lasing volume, as indicated by solid arrows 62. A deeper mesa etch and the deposition of an insulating layer outside the mesa are helpful in confining the current. Thus, VCSEL 50 includes double current confinement structure, i.e., mesa 55 and implant layer 57.

Thus, new and improved top emitting VCSELs are disclosed which are simpler to manufacture because of the self-alignment of the mirror etch and the impurity implant and the virtually self-aligned metalization. Further, because of the optical mode control provided by the trench and the the current distribution control provided by the impurity implant (and the mesa in some embodiments), the power output and efficiency of the laser are maximized. Finally, while the manufacture of a single laser has been discussed herein, it will be understood that individual lasers, arrays of lasers, semiconductor wafers of lasers, etc. can easily be manufactured by the disclosed process.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A method of fabricating a top emitting VCSEL including first and second stacks of mirrors deposited on either side of an active layer comprising the steps of:

defining an emitting area in the second stack of mirrors;

etching the second stack of mirrors to form a trench surrounding the emitting area and extending the depth of the trench sufficiently to reduce reflectivity below an amount required to support lasing in a non-lasing volume of the laser between the trench area and the active layer; and implanting an impurity in the non-lasing volume of one of the first and second stacks of mirrors to form an implant volume having a different conductivity than the one of the first and second stacks in which the implant is formed, and forming the implant volume so as to define a lasing volume axially aligned with the emitting area.

2. A method of fabricating a top emitting VCSEL as set forth in claim 1 wherein the step of implanting an impurity is performed in the second stack of mirrors.

3. A method of fabricating a top emitting VCSEL as set forth in claim 2 wherein the second stack of mirrors is an n-mirror stack and the step of implanting an impurity is performed in the second stack of mirrors by implanting a p-type buried layer.

4. A method of fabricating a top emitting VCSEL as set forth in claim 1 wherein the step of implanting an impurity is performed in the first stack of mirrors.

5. A method of fabricating a top emitting VCSEL as set forth in claim 4 wherein the first stack of mirrors is an n-mirror stack and the step of implanting an impurity is performed in the first stack of mirrors by implanting a p-type buried layer.

6. A method of fabricating a top emitting VCSEL as set forth in claim 1 wherein the etching is performed by ion milling.

7. A method of fabricating a top emitting VCSEL as claimed in claim 1 wherein the step of implanting an impurity includes implanting beryllium.

8. A method of fabricating a top emitting VCSEL as claimed in claim 1 including in addition the steps of depositing a conductive material in the trench to form a first electrical contact.

9. A method of fabricating a top emitting VCSEL as claimed in claim 1 including in addition the steps of depositing an optically transparent conductive material on the emitting area to form a first electrical contact.

10. A method of fabricating a top emitting VCSEL as claimed in claim 1 wherein the step of defining an emitting area includes the steps of applying a layer of photoresist to the second mirror stack and patterning the photoresist to define a trench area which is not covered by photoresist.

11. A method of fabricating a top emitting VCSEL comprising the steps of:

providing a substrate with first and second opposed major surfaces;

depositing a first stack of mirrors on the first major surface of the substrate;

depositing an active layer on the first stack of mirrors;

depositing a second stack of mirrors on the active layer;

defining an emitting area in the second stack of mirrors;

etching the second stack of mirrors to form a trench surrounding the emitting area and extending the depth of the trench sufficiently to reduce reflectivity below an amount required to support lasing in a non-lasing volume of the laser between the trench area and the active layer; and implanting an impurity in the non-lasing volume of one of the first and second stacks of mirrors to form an implant volume having a different conductivity than the one of the first and second stacks in which the implant is formed, and forming the implant volume so as to define a lasing volume axially aligned with the emitting area.

* * * * *